(12) United States Patent
Chen et al.

(10) Patent No.: US 7,368,785 B2
(45) Date of Patent: May 6, 2008

(54) MOS TRANSISTOR DEVICE STRUCTURE COMBINING SI-TRENCH AND FIELD PLATE STRUCTURES FOR HIGH VOLTAGE DEVICE

(75) Inventors: Li-Che Chen, Hsin-Chu (TW); Chih-Chong Wang, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 99 days.

(21) Appl. No.: 11/420,006

(22) Filed: May 24, 2006

(65) Prior Publication Data
US 2006/0270171 A1    Nov. 30, 2006

Related U.S. Application Data

(60) Provisional application No. 60/594,987, filed on May 25, 2005.

(51) Int. Cl.
*H01L 29/76* (2006.01)
(52) U.S. Cl. ................ 257/341; 257/409; 257/401; 257/288

(58) Field of Classification Search ............... 257/341, 257/41, 401, 901, 23, 24, 45, 288, 409, 500; 438/286, 297
See application file for complete search history.

(56) References Cited

U.S. PATENT DOCUMENTS

| 4,290,078 | A | * | 9/1981 | Ronen | 257/409 |
| 6,150,702 | A | * | 11/2000 | Funaki et al. | 257/409 |
| 6,246,101 | B1 | * | 6/2001 | Akiyama | 257/508 |
| 6,879,005 | B2 | * | 4/2005 | Yamaguchi et al. | 257/367 |

* cited by examiner

*Primary Examiner*—Mark A. Robinson
*Assistant Examiner*—Cathy Lam
(74) *Attorney, Agent, or Firm*—Winston Hsu

(57) ABSTRACT

A metal-oxide-semiconductor transistor device for high voltage (HV MOS) and a method of manufacturing the same are disclosed. The HV MOS transistor device comprises a field oxide region with an indented lower surface combined with a plurality of field plates to elongate the path for disturbing the lateral electric field, therefore the transistor device has a relatively small size.

18 Claims, 12 Drawing Sheets

MOS TRANSISTOR DEVICE STRUCTURE COMBINING SI-TRENCH AND FIELD PLATE STRUCTURES FOR HIGH VOLTAGE DEVICE

CROSS REFERENCE TO RELATED APPLICATIONS

This application claims priority from U.S. provisional application No. 60/594,987 by Chen et al., filed May 25, 2005, entitled "Super HV LDMOS device structure-combination of Si-trench and field plate structures".

BACKGROUND OF THE INVENTION

1. Field of the Invention

The present invention relates to super high voltage semiconductor devices and, more particularly, to a high voltage metal-oxide-semiconductor (HV MOS) transistor device having a structure of a combination of trench and field plate structures.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffused MOS (LDMOS), is employed to increase power switching efficiency and decrease the loss of energy resources. It is often required that the switching transistors withstand high breakdown voltages. LDMOS transistors are particularly prevalent because they can operate with a high efficiency and their planar structure allows for easy integration on a semiconductor die with other circuitry.

For the structure of a conventional HV LDMOS transistor device, a field oxide region with a long lateral width is positioned between the gate and drain to increase the breakdown voltage and prevent the high voltage device from breaking down. While, to achieve a good improvement of the breakdown voltage, a certain width is needed for the field oxide region and the resulting size of the device is relatively large.

In order to reduce the size at the same performance, it is known that a plurality of field plates is formed to be arranged on the field oxide region. FIG. 1 schematically illustrates a cross-sectional view of a conventional super high voltage NMOS transistor device. The conventional super high voltage NMOS transistor device 1 is fabricated on an active area of a semiconductor substrate 10 such as a P type silicon substrate. The active area is isolated with a peripheral field oxide region. Generally, the conventional super high voltage NMOS transistor device 1 comprises a source diffusion region 12, a gate 14 and a drain diffusion region 16. The source diffusion region 12 is a heavily N doped region bordering upon a heavily P doped region 18, both of which are formed within a P-type well 20. The distance between the drain diffusion region 16 and the source diffusion region 12 may be a few micrometers. The drain diffusion region 16 is a heavily N doped drain and is formed within an N-type well 22 that is formed within a deep N-type well 24, forming a triple-well structure.

As shown in FIG. 1, a gate dielectric layer 26 is formed on the source diffusion region 12. The gate 14 is formed on the gate dielectric layer 26 and laterally extends over a field oxide layer 28. The field oxide layer 28 is formed between the source diffusion region 12 and drain diffusion region 16 using a local oxidation of silicon (LOCOS) technique. Furthermore, a plurality of floating field plates 30 is formed on the field oxide layer 28 to disturb the lateral electric field. Accordingly, the size of the conventional super high voltage NMOS transistor device 1 has a smaller size than that of the conventional super high voltage NMOS transistor without field plates.

However, there is still a need for an improved HV MOS structure and the manufacturing method to reduce the size or to improve breakdown voltage of the HV MOS transistor device.

SUMMARY OF THE INVENTION

It is an object of the present invention to provide an improved HV MOS transistor device, which has a reduced device size.

It is another object of the present invention to provide a method of manufacturing the improved HV MOS transistor device having a reduced device size.

The HV MOS transistor device according to the present invention includes a first semiconductor region; a second semiconductor region; a long pass isolation arranged between the first semiconductor region and the second semiconductor region, the long pass isolation having a lower surface and an upper surface, wherein the lower surface is non-planar and in a shape of a plurality of protrusions; a plurality of field plates formed on or embedded in the long pass isolation; a gate dielectric layer formed on the first semiconductor region; and a gate formed on the gate dielectric layer and laterally extending onto the long pass isolation.

In one aspect, the method of manufacturing a high voltage semiconductor device according to the present invention includes the steps as follows. First, a substrate of a first conductivity type is provided. A plurality of trenches comprising sidewalls and bottoms are formed in the substrate. A local oxidation of silicon (LOCOS) process is performed on the sidewalls and bottoms of the trenches and on the substrate near the trenches to form a first field oxide region combined with the trenches, such that the first field oxide region has a lower surface in a shape of a plurality of protrusions. A deep well of a second conductive type is formed in the substrate. A source diffusion region and a drain diffusion region are formed respectively, wherein the first field oxide region is positioned between the source diffusion region and the drain diffusion region. A gate dielectric layer is formed on the source diffusion region. A gate is formed on the gate dielectric layer to laterally extend onto the first field oxide region. Finally, a plurality of field plates is formed corresponding to the trenches.

In another aspect, the method of manufacturing a high voltage semiconductor device according to the present invention includes the steps as follows. First, a substrate of a first conductivity type is provided. A first local oxidation of silicon (LOCOS) process is performed on the substrate to form a field oxide region. A plurality of trenches comprising sidewalls and bottoms is formed to be arranged in the field oxide region. A deep well of a second conductive type is formed in the substrate. A source diffusion region and a drain diffusion region are formed respectively, wherein the first field oxide region is positioned between the source diffusion region and the drain diffusion region. A gate dielectric layer is formed on the source diffusion region. A gate is formed on the gate dielectric layer to laterally extend onto the field oxide region. Finally, a plurality of field plates is formed corresponding to the trenches.

The HV MOS device of the present invention includes a plurality of protrusions of the field oxide region extending to the deep well and a plurality of field plates on or in the field oxide region between the gate and the drain or source, effectively elongating the electric current path between the gate and the drain or source. Accordingly, the HV MOS device has a reduced size with an improved performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
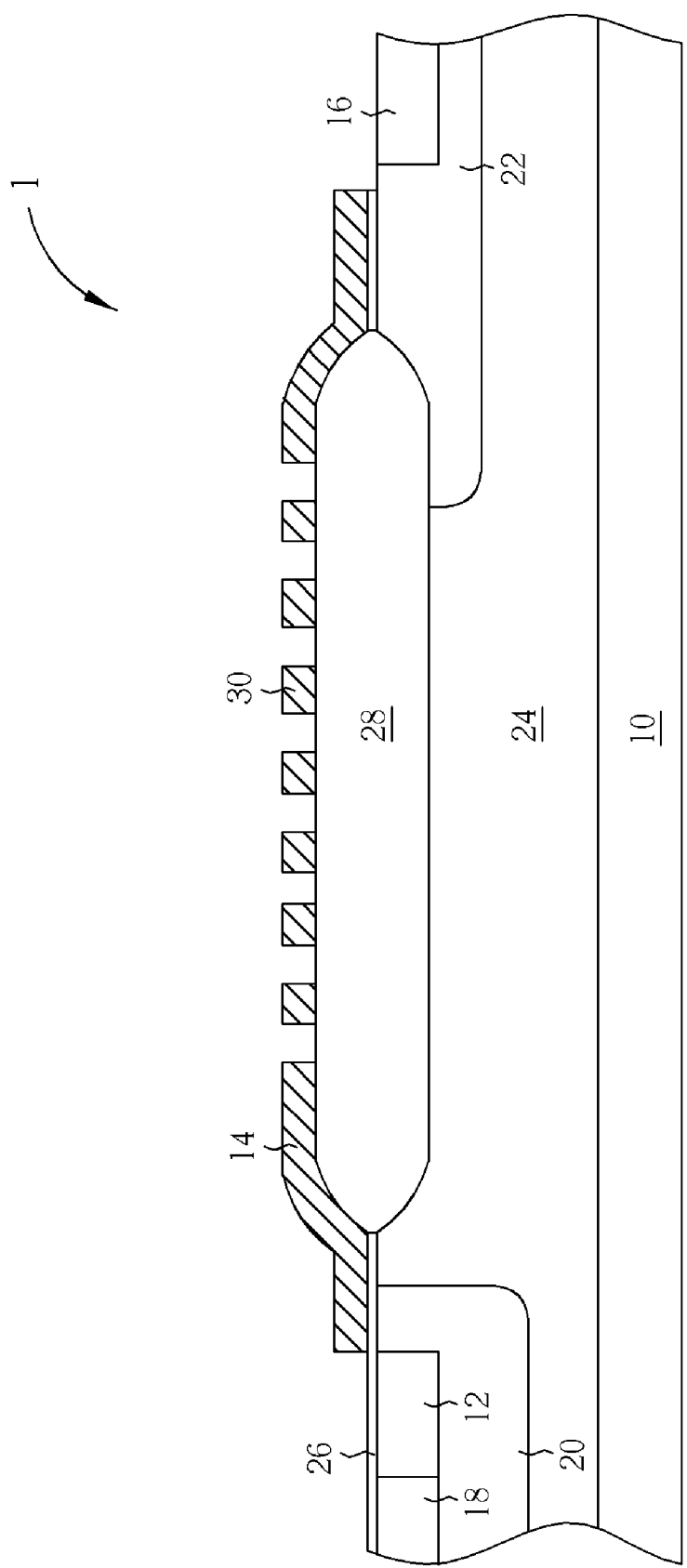
FIG. 1 schematically illustrates a cross-sectional view of a conventional high voltage NMOS transistor device.
Figure 2:
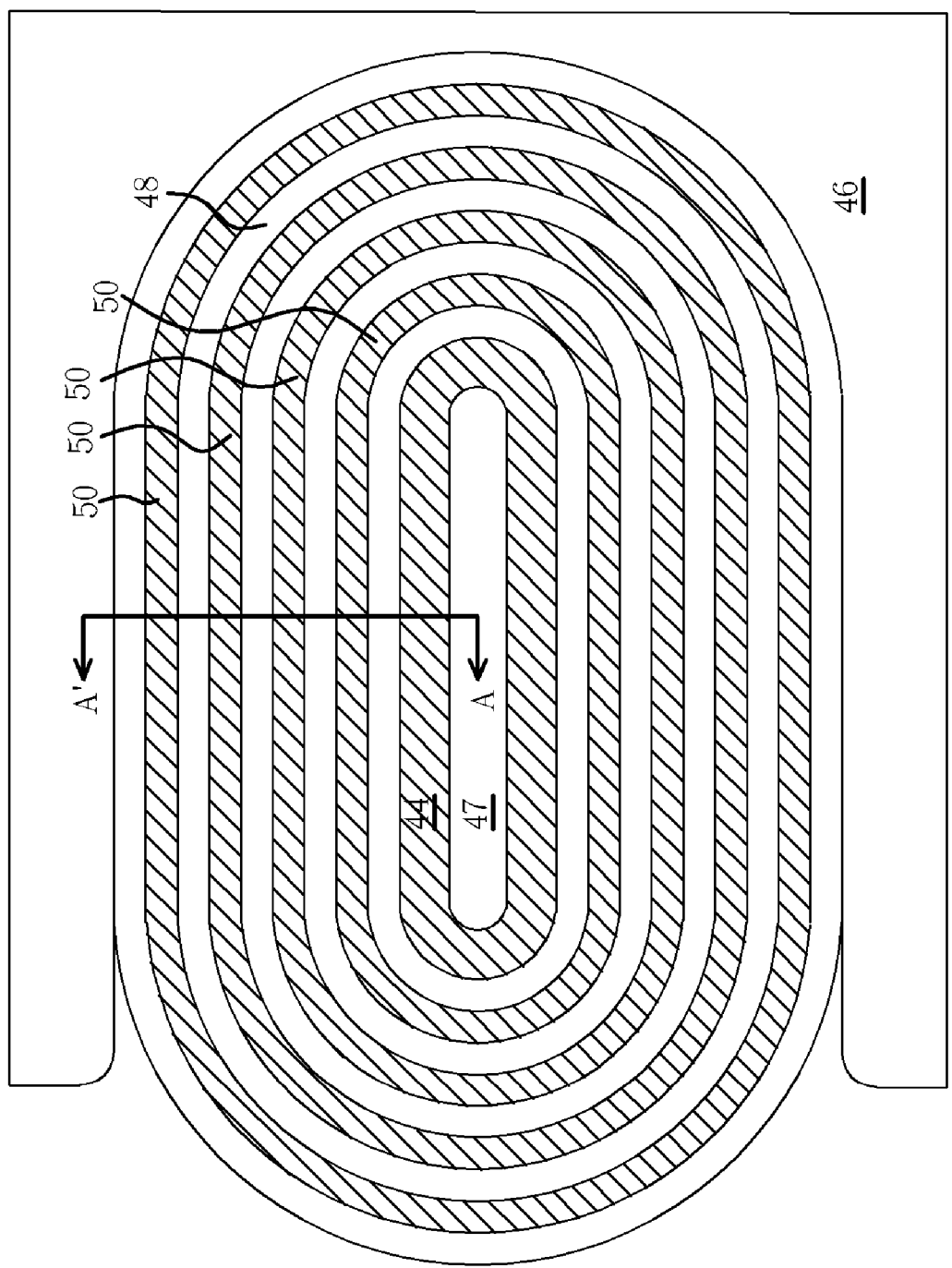
FIG. 2 is a schematic top view illustrating an embodiment of the HV MOS transistor device according to the present invention.
Figure 3:
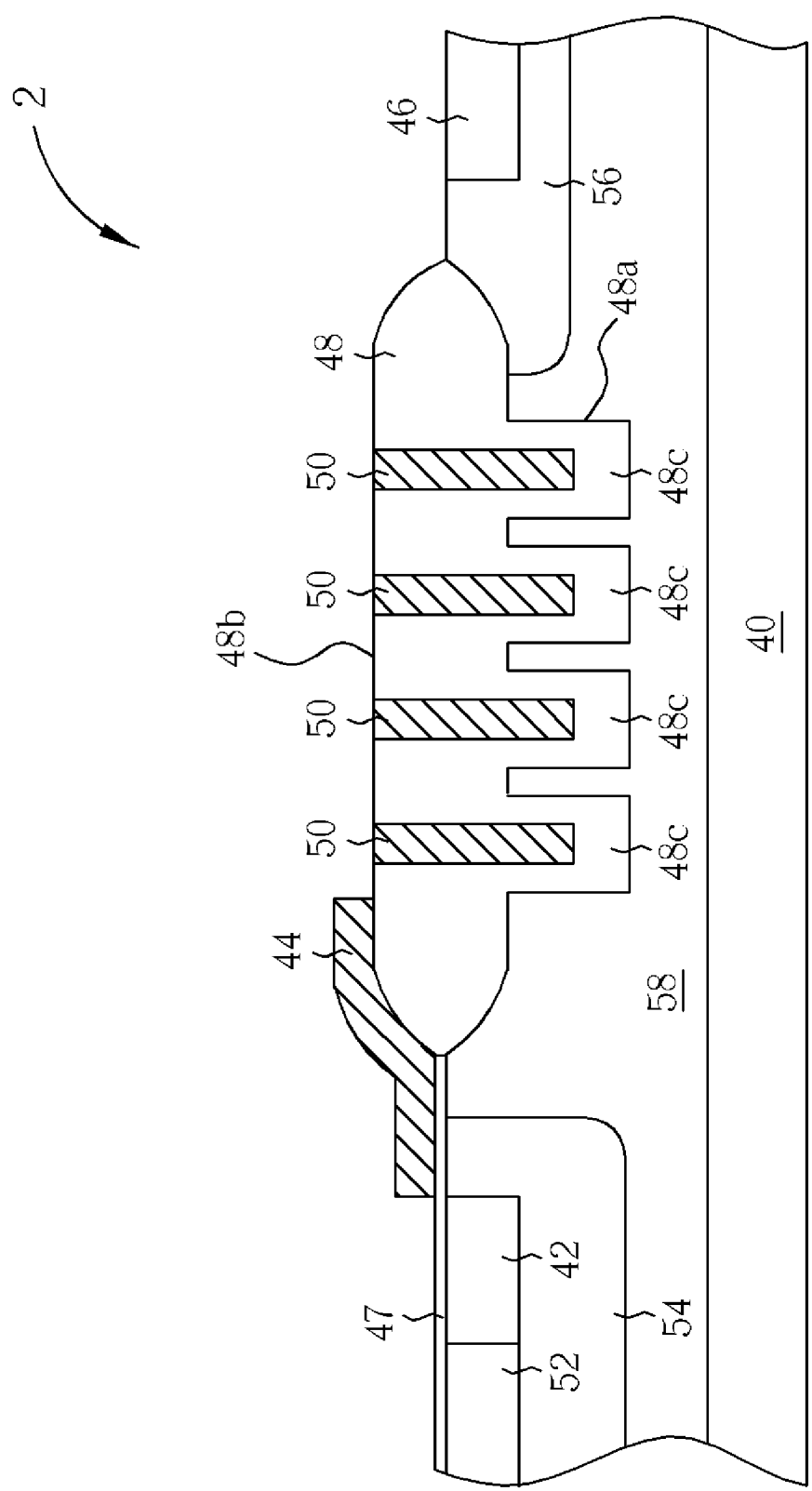
FIG. 3 is a schematic cross-sectional view taken along line A-A' of FIG. 2 in one aspect.

The present invention is more described in detail by the embodiments set forth as follows. FIGS. 2 and 3 show an embodiment of the high voltage NMOS transistor device according to the present invention. FIG. 2 shows a top view and FIG. 3 shows a cross-sectional view taken along line A-A' of FIG. 2. It is understood that the charge properties shown in figures are exemplary, and suitable modification of the polarities can be made to form a super high voltage PMOS transistor device.

The super high voltage NMOS transistor device 2 is formed on a semiconductor substrate 40 and includes a source diffusion region 42, a drain diffusion region 46, and a gate 44. A gate dielectric layer 47 is formed between the source diffusion region 42 and the gate 44. The gate 44 may be made of polysilicon or metals and is isolated from the drain 46 with a long pass isolation 48 therebetween. The long pass isolation 48 is a field oxide region and a lower surface of the long pass isolation 48 may be non-planar, for example, in a shape of a plurality of protrusions. As shown in FIG. 3, the long pass isolation 48 has a lower surface 48a and an upper surface 48b. The lower surface 48a is in a shape of a plurality of protrusions 48c extending into the deep well 58, such that the path for disturbing the HV electric field from the gate 44 to the drain 46 may be increased to effectively reduce the strength of the electric field while the length of the field oxide region may be minimized as compared with the conventional ones, and thus the size of the device is decreased. The arrangement of the protrusions is not limited to a specific shape, and may be in a, for example, rectangular, triangular, arch shape, and the like, from a cross-sectional top view.

In this embodiment, the upper surface 48b may be in a shape of a plurality of indents locating at positions corresponding to the protrusions 48c in a manner such that the long pass isolation 48 comprises a plurality of trenches. The trenches may be filled with a conductive material, such as silicon, polysilicon, or metal, to form a plurality of field plates 50 for disturbing the lateral electric field to reduce the breakdown voltage of the device.

The term "long pass isolation" used herein means the isolation from the gate and the drain or source has a long pass of a current path to be distinguished from a conventional isolation without a protruded bottom surface. The long pass isolation may comprise a dielectric material.

Figure 4:
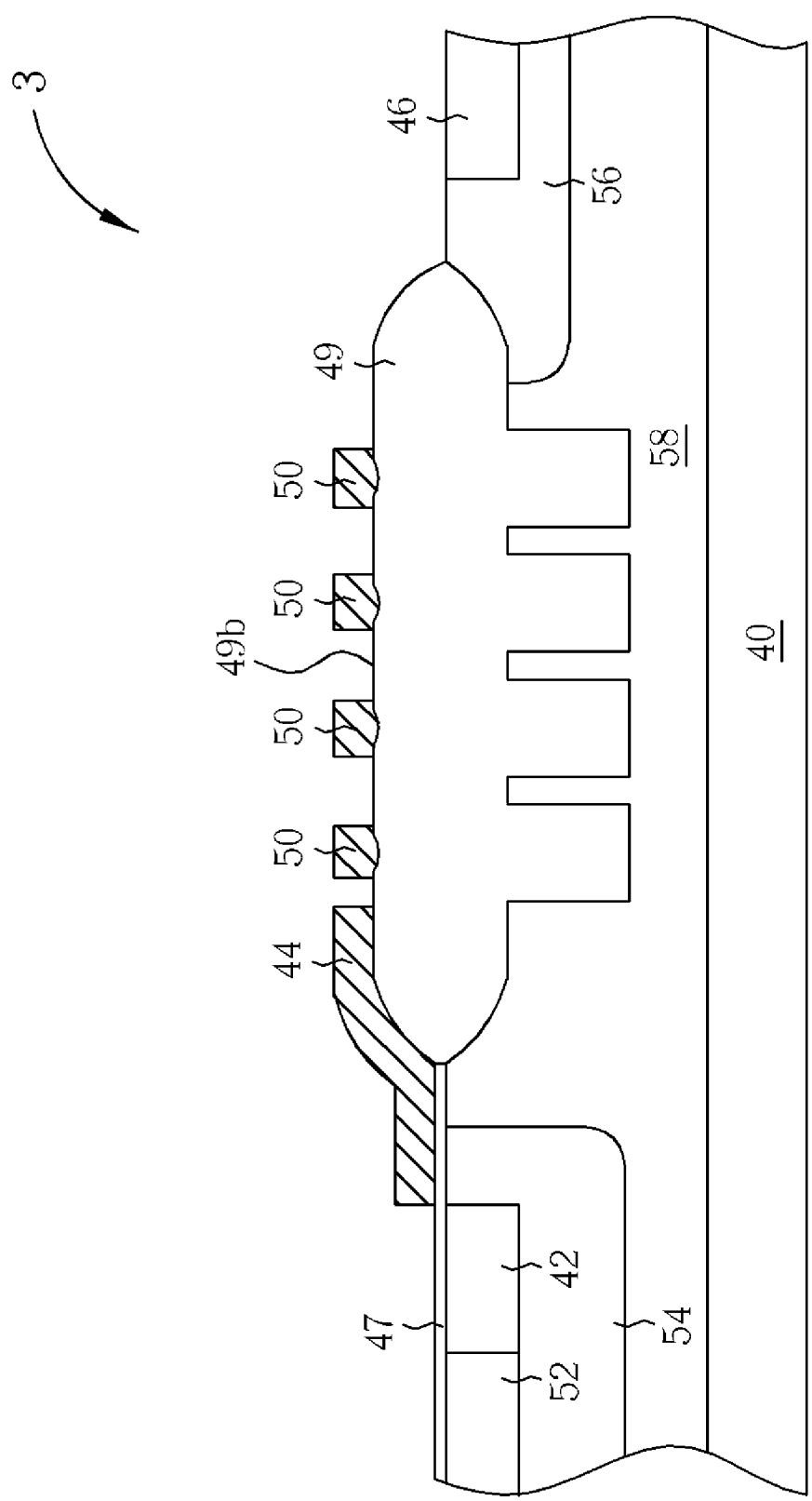
FIG. 4 is a schematic cross-sectional view taken along line A-A' of FIG. 2 in another aspect.

The field plates 50 shown in FIG. 3 are embedded in the field oxide region, but the depth of the field plates is not limited as long as the effect on disturbing the lateral electric field can be attained. The upper surface of the long pass isolation may be planar, as shown in FIG. 4. FIG. 4 is a schematic cross-sectional view taken along line A-A' of FIG. 2 in another aspect for a HV MOS transistor device 3 according to the present invention. FIG. 4 shows that the trenches are filled with dielectric material and the field plates 50 are formed on the upper surface 49b of a long pass isolation 49, and the upper surface 49b may be planar.

As shown in both FIGS. 3 and 4, the source 42 may be heavily N doped and borders a heavily P doped region 52, both of which are formed within a P-type well 54. The distance between the drain 46 and the source 42 may be a few micrometers or more. The drain 46 is heavily N doped and formed within an N-type well 56, that may be further formed within a deep N-type well 58 to form a triple gradient well structure.

As shown in the top view of FIG. 2, the gate 44 and the field plates 50 are formed in concentric circles each other spaced with part of the long pass isolation 48. The source diffusion region 42 of the HV DMOS transistor device is positioned in the center region of the concentric circles, and the drain diffusion region 46 is formed at the peripheral of the concentric circles. The configuration is not limited to the shape of circle, and it may be in rectangular shape or the field plates may be continuously arranged in a spiral shape. The field plates may be distributed uniformly or non-uniformly. That is, the field plates may have various widths, the intervals between two adjacent field plates may be different, or both, as desired. For example, the field plates may be distributed more densely in areas with large voltage drops than those in areas with low voltage drops, to more effectively decrease the voltage. High voltage drops often occur in regions near the gate or the drain.

Figure 5:
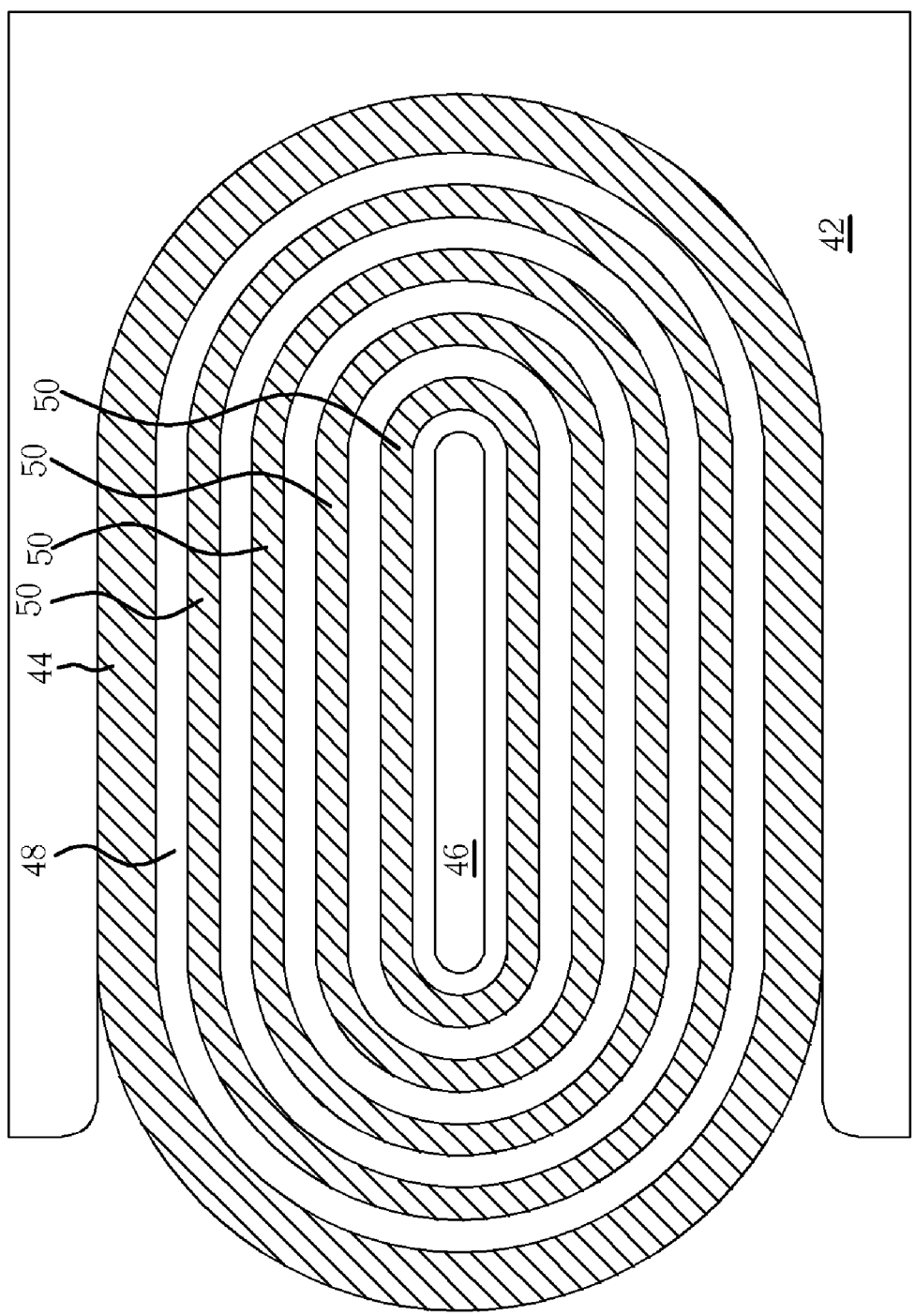
FIG. 5 is a schematic top view illustrating another embodiment of the HV MOS transistor device according to the present invention.

The structure of the HV MOS transistor device is not limited to the structure shown in FIGS. 2 and 3 or 4. FIG. 5 is a schematic top view illustrating another embodiment of the HV MOS transistor device according to the present invention. The field plates 50 and the gate 44 are formed in concentric circles each other spaced with part of the long pass isolation 48. The drain diffusion region 46 of the HV MOS transistor device is positioned in the center region of the concentric circles, and the source diffusion region 42 is formed at the peripheral of the concentric circles. The gate 44 is adjacent to the source diffusion region 42 with a gate dielectric layer therebetween.

Figure 6:
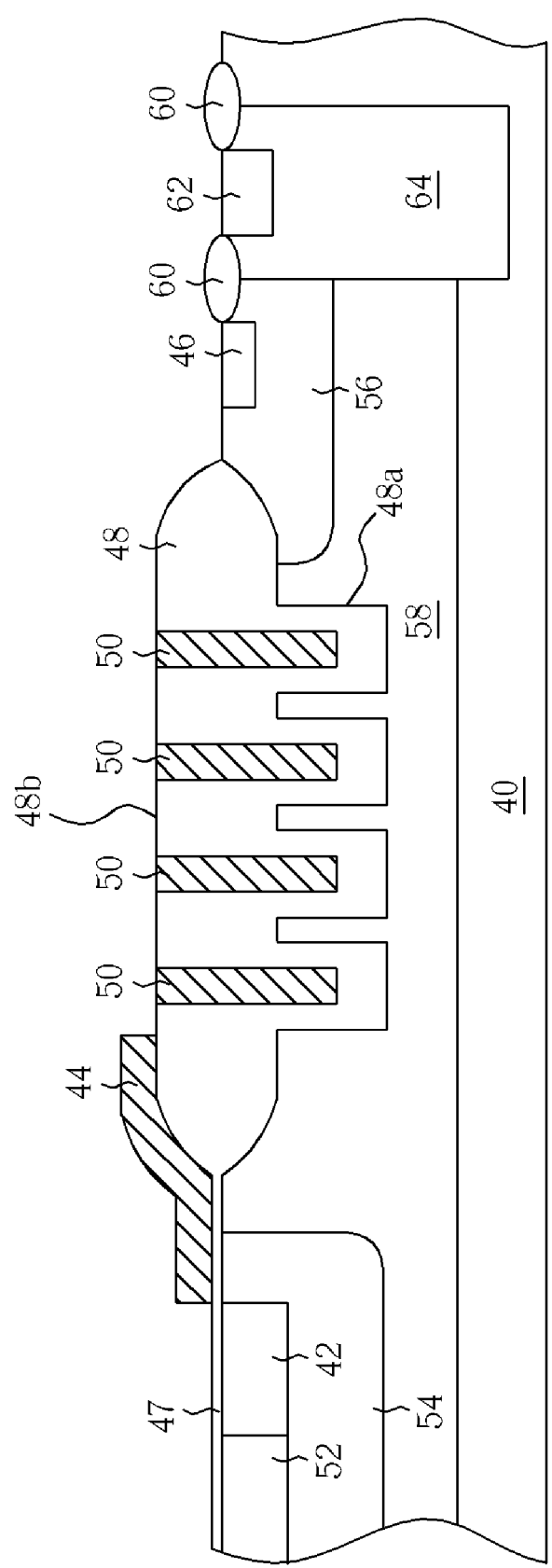
FIG. 6 is a schematic cross-sectional diagram illustrating still another embodiment of the HV MOS transistor device with a guard ring according to the present invention.

The structure of the HV MOS transistor device according to the present invention may further comprise a guard ring outside of the high voltage semiconductor device to electrically isolate MOS transistor devices. The guard ring serves as a channel stop by being doped with dopants of charge opposite the source diffusion region and the drain diffusion region, to provide electrical isolation between high voltage devices. FIG. 6 shows an embodiment that a guard ring structure is aside the drain diffusion region 46. The guard ring comprises two oxide field regions 60 spaced with a heavily doped p-type region 62, built in a top portion of a P-type well 64.

In addition to MOS transistor device, the present invention may be also applied to, but not limited to, an insulated gate bipolar transistor (IGBT), and for manufacturing high voltage devices in the chips. The present invention may be also applicable to double diffuse drain (DDD) structures.

In the manufacturing method of the HV MOS transistor device according to the present invention, the long pass isolation may be formed through forming trenches first and thereafter forming a field oxide region, or forming a field oxide region first and thereafter forming trenches. FIGS. 7-12 show various embodiments according to the present invention.

Figure 7:
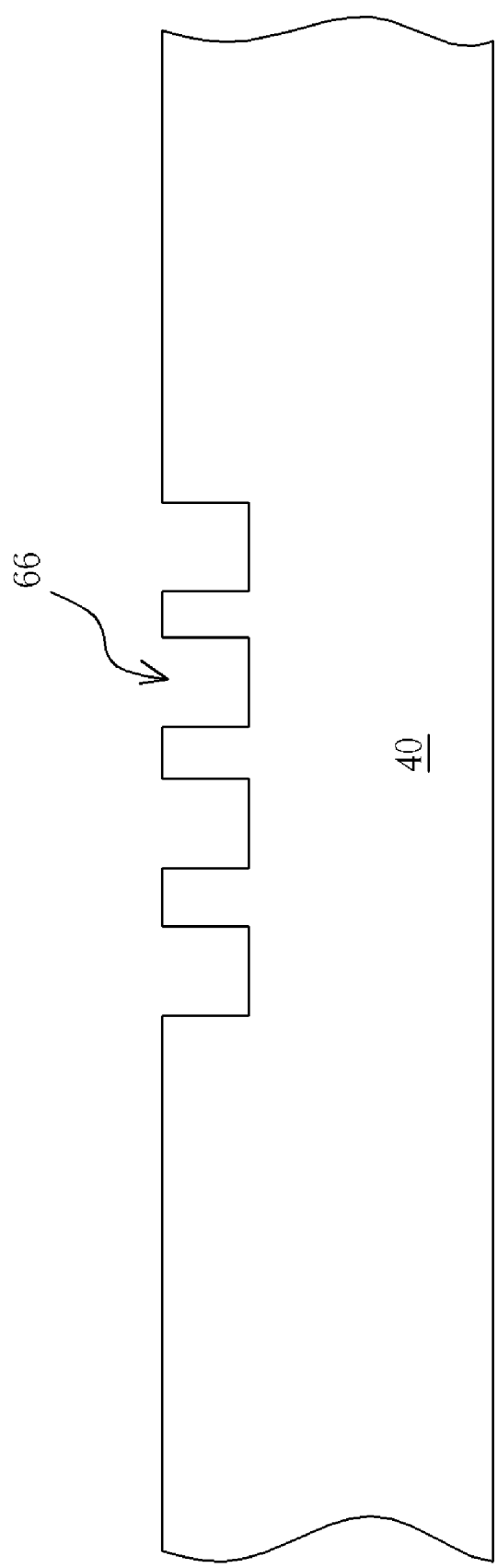
FIGS. 7-12 are schematic cross-sectional diagrams illustrating embodiments of the manufacturing process of an HV MOS transistor device according to the present invention.
Figure 8:
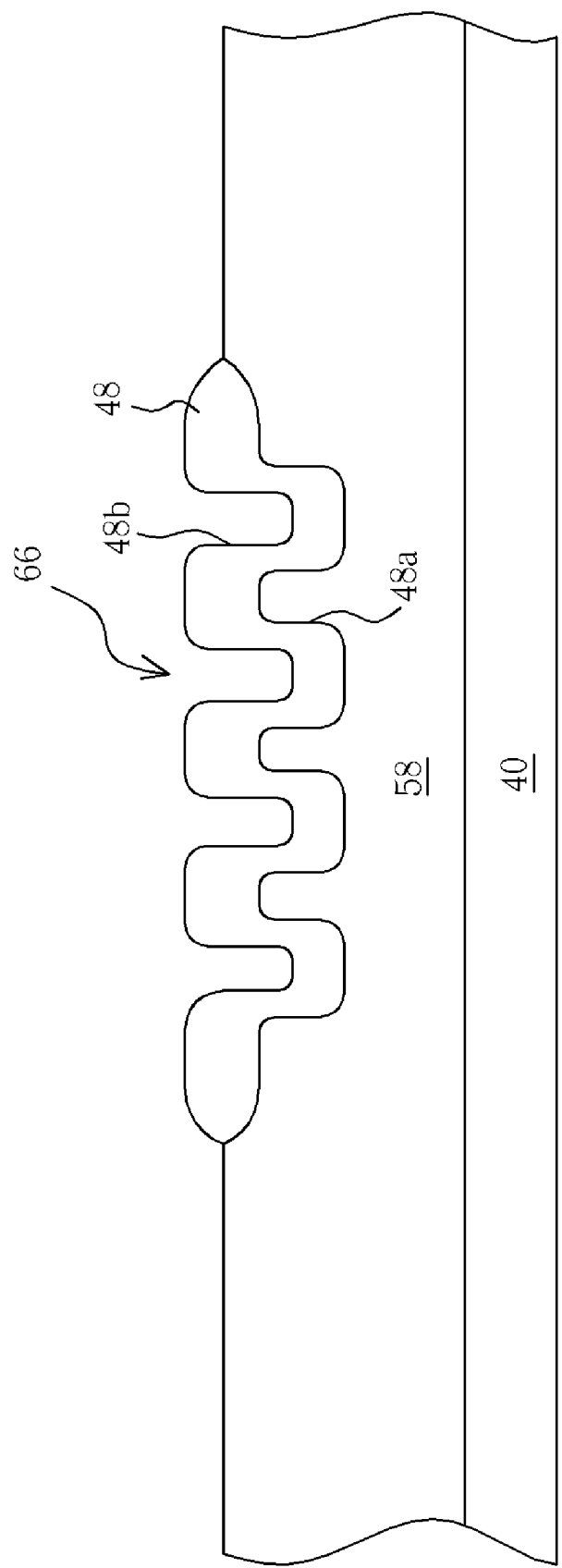

The long pass isolation may be formed through forming trenches first and thereafter forming a field oxide region. FIGS. 7 and 8 show schematic cross-sectional diagrams illustrating an embodiment of the manufacturing process of super high voltage NMOS transistor device according to the present invention. As shown in FIG. 7, trenches 66 are formed on a P-type silicon substrate 40 at a location corresponding to the position of an isolation between the source diffusion region and the drain diffusion region, through a photolithography process and an etching process. The trenches comprise sidewalls and bottoms in any shape.

Thereafter, as shown in FIG. 8, a local oxidation of silicon (LOCOS) is performed on the sidewalls and bottoms of the trenches 66 and on the substrate 40 near the trenches 66, to form a long pass isolation 48 combined with the trenches 66. Accordingly, the long pass isolation 48 is obtained and has a lower surface 48a in a plurality of protrusions and an upper surface 48b in a plurality of indents. The trenches 66 retain an opening and are combined with the long pass isolation 48. Thereafter, a deep N-type well 58 may be formed in the P-substrate 40 by doping.

Figure 9:
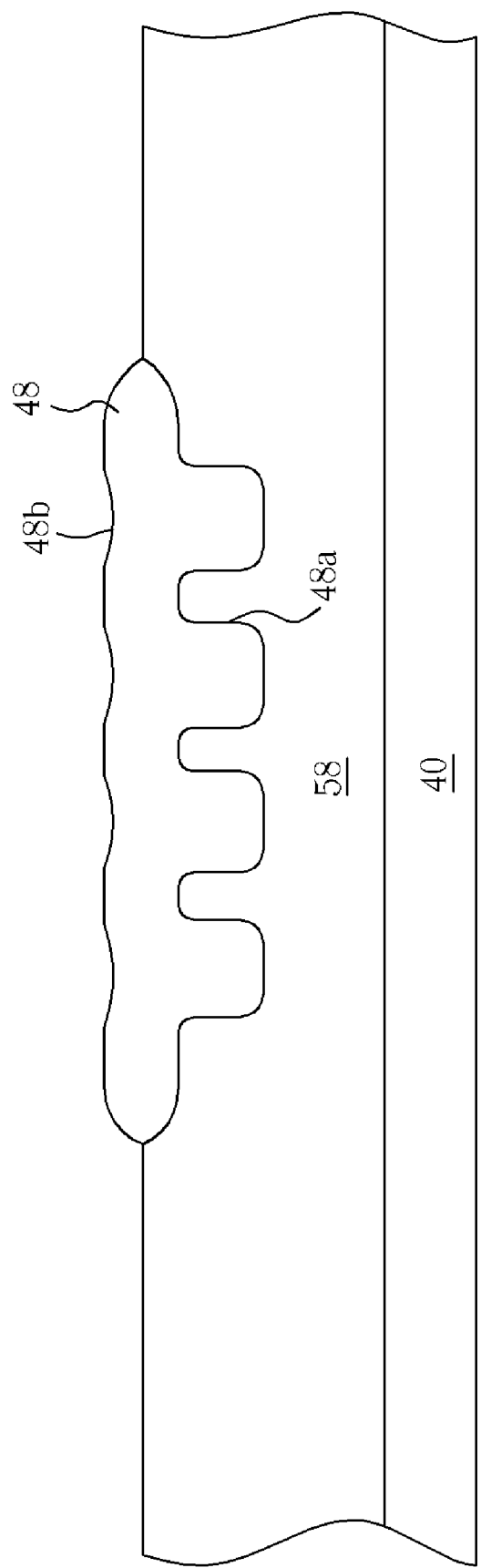

In another embodiment, after the LOCOS process is performed, the trenches 66 may be filled up with oxide by using a proper trench size and a proper LOCOS process, as shown in FIG. 9, instead of the structure shown in FIG. 8. The long pass isolation 48 has a lower surface in a shape of a plurality of protrusions as well as a planar upper surface 48b.

Figure 10:
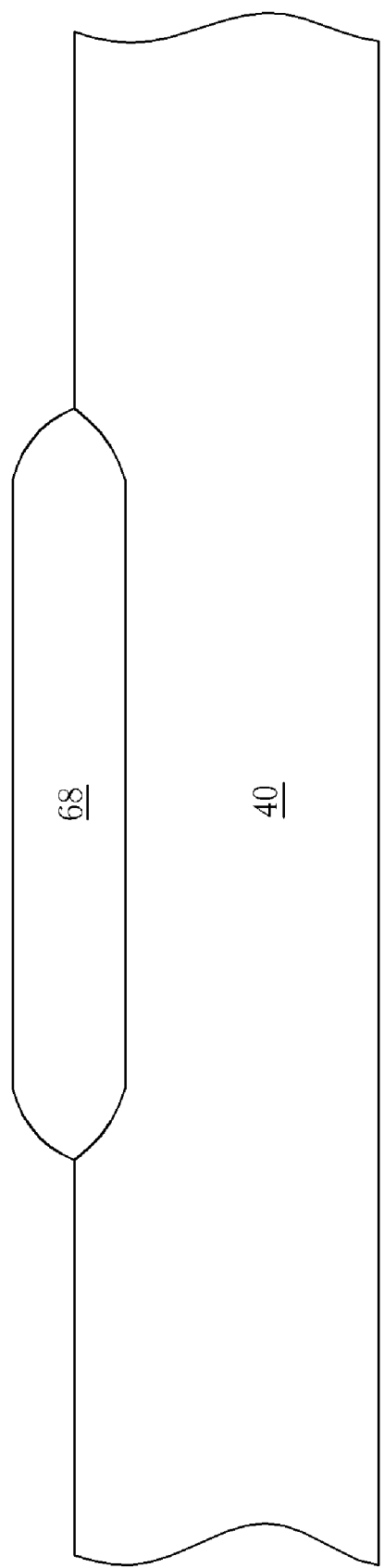
Figure 11:
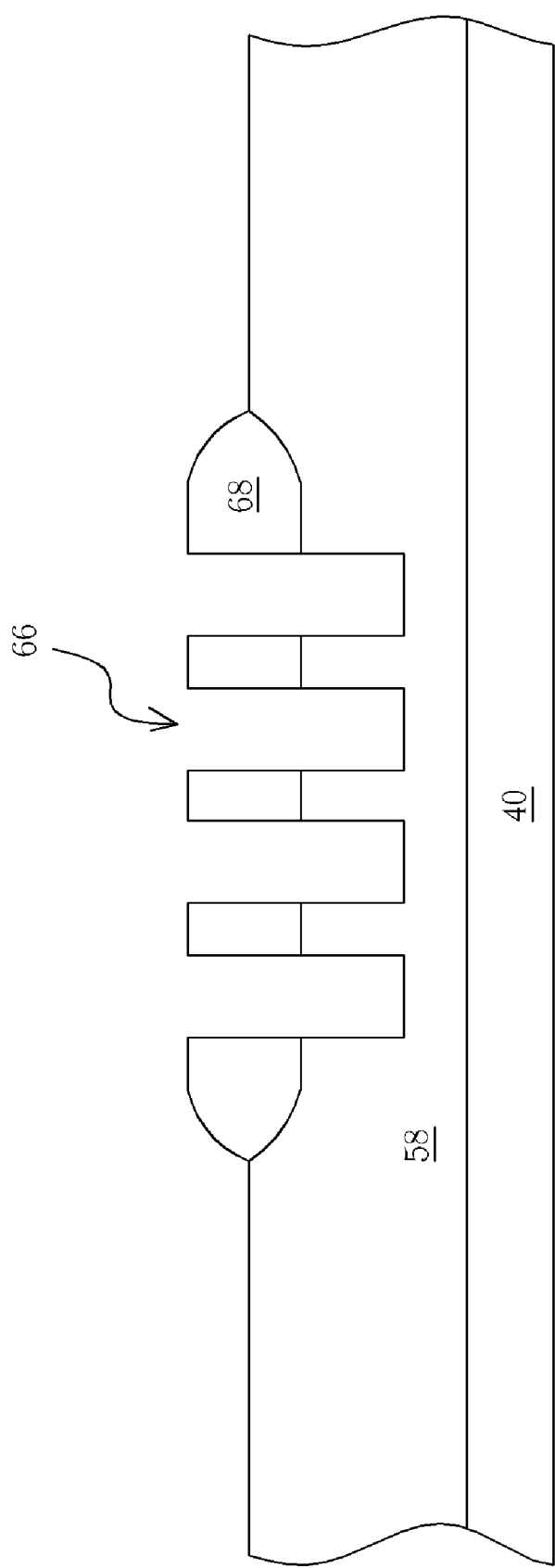

Alternatively, the long pass isolation may be formed through forming a field oxide region first and thereafter forming trenches. FIGS. 10 and 11 show schematic cross-sectional diagrams illustrating another embodiment of the manufacturing process of super high voltage NMOS transistor device according to the present invention. As shown in FIG. 10, a LOCOS is performed on a predetermined isolation region between the drain and the source to form a field oxide region 68. As shown in FIG. 11, trenches 66 are formed at a location of the field oxide region 68 through a photolithography process and an etching process. The trenches 66 may have bottom parts inside or the field oxide region 68 or below the lower surface of the field oxide region 68. If the bottom parts are below the lower surface of the field oxide region 68, it means that the sidewalls in part and the bottoms of the trenches are composed of silicon. A LOCOS may be performed to further oxidize the silicon on the sidewalls and bottoms of the bottom parts of the trenches. Alternatively, a deposition may be performed to form a dielectric material layer on the sidewalls and bottoms of the bottom parts of the trenches. Such that, the trenches may be formed with an entire dielectric material, and a continuous dielectric material layer as a field oxide region 68 may be obtained to perform the long pass isolation as shown in FIG. 8 or 9 and to combine with the trenches 66. Accordingly, the long pass isolation 48 has a lower surface in a plurality of protrusions and an upper surface in a plurality of indents. The trenches 66 retain an opening and are combined with the long pass isolation 48. Thereafter, a deep N-type well 58 may be formed in the P-substrate 40 by doping.

In another embodiment, the trenches 66 may be filled up by using a proper trench size and a proper LOCOS process or a deposition process, obtaining the long pass isolation 48 having a lower surface in a shape of a plurality of protrusions and a planar upper surface as shown in FIG. 9.

Figure 12:
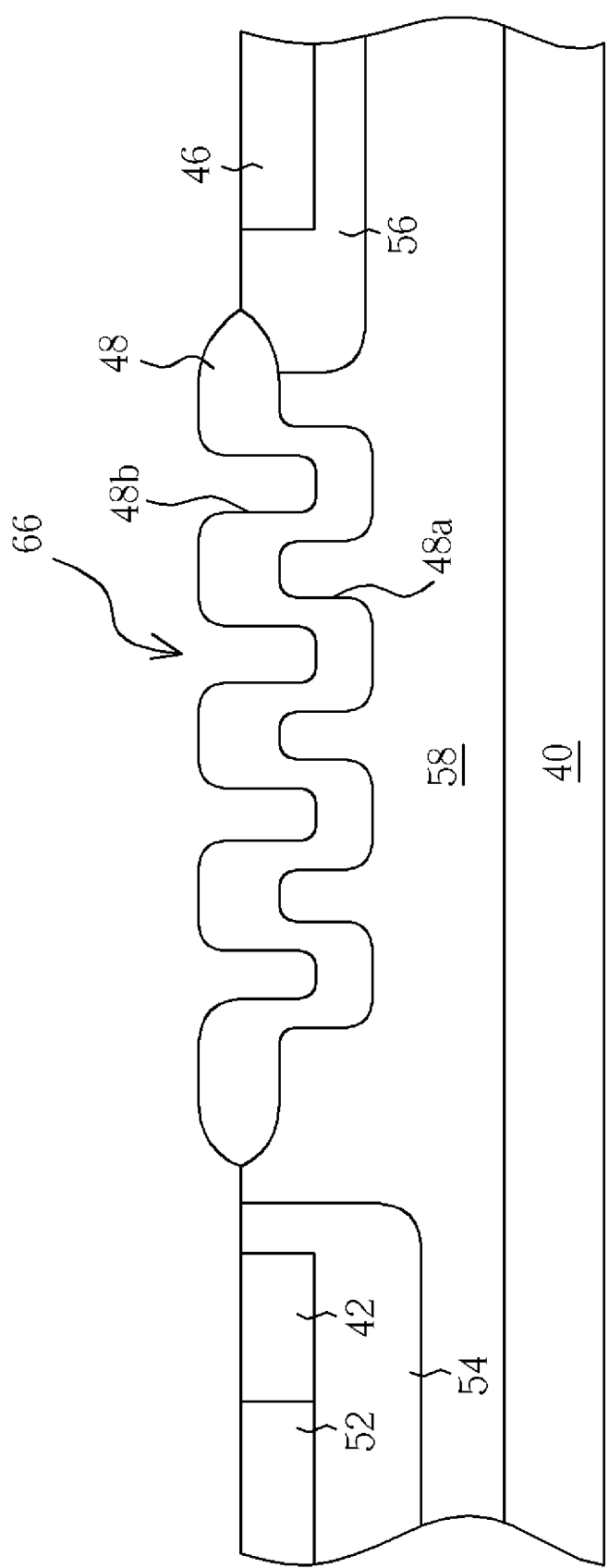

After the formation of the long pass isolation, as shown in FIGS. 6-11, the following steps are performed similarly to the conventional processes. Referring to FIG. 12, showing the manufacturing steps after those as shown in FIG. 8, two regions of the substrate 40 are incorporated with different conductivity type of ions, forming a P-type well 54 and an N-type well 56, respectively. Next, a heavily P doped region 52 with higher doping concentration is formed in the P-type well 54, and a source diffusion region 42 and a drain diffusion region 46 are formed in the P-type well 54 and the N-type well 56. The source diffusion region 42 borders the heavily P doped region 52, such that the P-type well 54 encompasses the source diffusion region 42 and the heavily P doped region 52.

Subsequently, a layer of dielectric material, such as oxide, is deposited on the surface of the source diffusion region 42 and the heavily P doped region 52 to form a gate dielectric layer 47. Then, a gate 44 is formed on the gate dielectric layer 47 to laterally extend onto the long pass isolation 48. The trenches 66 may be filled with a same or different material from that of the gate 44 before, after, or at the same time (simultaneously) of the formation of the gate 44, to form a plurality of field plates 50. An HV MOS transistor device as shown in FIG. 3 is accomplished.

Furthermore, if a guard ring is desired in the structure of the HV MOS transistor device, the P-type well 64 may be formed in a predetermined guard ring region at the periphery of the HV MOS transistor device by doping when the P-type well 54 is formed, and the heavily doped P-type region 62 may be formed when the heavily P doped region 52 is formed. The field oxide regions 60 may be formed when the field oxide region of the long pass isolation 48 is formed. The HV MOS transistor device with a guard ring is obtained as shown in FIG. 6.

In case the long pass isolation is formed with a planar upper surface, the field plates may be formed on the upper surface, and moreover they may be formed on positions corresponding to the protrusion of the lower surface. The resulting HV MOS transistor device may be as shown in FIG. 4.

In the HV MOS transistor device according to the present invention, the field oxide region combined with a plurality of trenches has a relatively long lower surface, as compared with the conventional ones, to serve as a long pass isolation between the gate and the drain with the field plates combined together to effectively improve the breakdown voltage, and the device size can be significantly reduced.

All combinations and sub-combinations of the above-described features also belong to the present invention. Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A high voltage metal-oxide-semiconductor (HV MOS) transistor device, comprising:
    a first semiconductor region;
    a second semiconductor region;
    a long pass isolation arranged between the first semiconductor region and the second semiconductor region, the long pass isolation having a lower surface and an upper surface, wherein the lower surface is non-planar and in a shape of a plurality of protrusions;
    a plurality of field plates formed on or embedded in the long pass isolation;
    a gate dielectric layer formed on the first semiconductor region; and
    a gate formed on the gate dielectric layer and laterally extending onto the long pass isolation.

2. The HV MOS transistor device as claimed in claim 1, wherein the upper surface has a shape of a plurality of indents, and the field plates are formed in the indents.

3. The HV MOS transistor device as claimed in claim 2, wherein the indents of the upper surface locate at positions corresponding to the protrusions of the lower surface in a manner such that the long pass isolation comprises a plurality of trenches and the field plates are filled in the trenches.

4. The HV MOS transistor device as claimed in claim 1, wherein the field plates are formed on the long pass isolation corresponding to positions of the protrusions of the lower surface.

5. The HV MOS transistor device as claimed in claim 1, wherein the field plates are formed so as to surround the first semiconductor region.

6. The HV MOS transistor device as claimed in claim 1, wherein the field plates concentrically surround the first semiconductor region.

7. The HV MOS transistor device as claimed in claim 1, wherein the field plates spirally surround the first semiconductor region.

8. The HV MOS transistor device as claimed in claim 1, wherein the field plates are formed so as to surround the second semiconductor region.

9. The HV MOS transistor device as claimed in claim 1, wherein the field plates concentrically surround the second semiconductor region.

10. The HV MOS transistor device as claimed in claim 1, wherein the field plates spirally surround the second semiconductor region.

11. The HV MOS transistor device as claimed in claim 1, wherein the field plates are distributed with uniform intervals between each other.

12. The HV MOS transistor device as claimed in claim 1, wherein the field plates are distributed with non-uniform intervals between each other.

13. The HV MOS transistor device as claimed in claim 1, wherein the first semiconductor region comprises a first conductivity type doped region, and a heavy first conductivity type doped region and a heavy second conductivity type doped region formed in the first conductivity type doped region.

14. The HV MOS transistor device as claimed in claim 1, wherein the second semiconductor region comprises a light second conductivity type doped region, and a heavy second conductivity type doped region formed in the light second conductivity type doped region.

15. The HV MOS transistor device as claimed in claim 1, wherein the gate and the field plates all comprise polysilicon or metal.

16. The HV MOS transistor device as claimed in claim 1, further comprising a deep second conductivity type well, wherein the first semiconductor region, the second semiconductor region, and the long pass isolation are formed in the deep second conductive type well.

17. The HV MOS transistor device as claimed in claim 1, which is formed on a first conductivity type substrate.

18. The HV MOS transistor device as claimed in claim 1, further comprises a guard ring at a periphery of the HV MOS transistor device.

* * * * *